(12) United States Patent
Vandyke

(10) Patent No.: US 10,303,814 B1
(45) Date of Patent: May 28, 2019

(54) SIMULATING INTERMODS OF HIGH CARRIER COUNT SIGNALS

(71) Applicant: Keysight Technologies, Inc, Minneapolis, MN (US)

(72) Inventor: Rulon Vandyke, Suwanee, GA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1118 days.

(21) Appl. No.: 13/755,338

(22) Filed: Jan. 31, 2013

(51) Int. Cl.
*G06F 17/10* (2006.01)
*G06F 17/50* (2006.01)

(52) U.S. Cl.
CPC .................. *G06F 17/5009* (2013.01)

(58) Field of Classification Search
CPC ............. G06F 17/5009; G06F 17/5018; G06F 17/5036
USPC ...................................... 703/1, 2, 6
See application file for complete search history.

(56) References Cited

U.S. PATENT DOCUMENTS

| | | | | |
|---|---|---|---|---|
| 6,111,462 A | * | 8/2000 | Mucenieks | H03F 1/3223 330/149 |
| 6,430,220 B1 | * | 8/2002 | Determan | H03K 7/08 330/10 |
| 2007/0086713 A1 | * | 4/2007 | Ingmar | G02F 1/365 385/122 |

OTHER PUBLICATIONS

Yanikgonul et al. (A practical Simulation Tool for predicting spectral regrowth in Communication Satelite, 2012 (6 pages)).*
Reyes-Ayala et al. (N-Carrier Frequency Domain Calculation of Intermodulation in Satelite HPA, 2005 (5 pages)).*
Joel Vuolevi (Analysis, measurement, and cancellation of the bandwidth and amplitude dependence of intermodulation distortion in RF power amplifiers, 2001 (151 pages)).*
Chen et al. (Simulation and Modeling of Intermodulation Distortion, 1999).*
Jose Carlos Pedro, "Intermodulation Distortion in Microwave and Wireless Circuits", Artech House, Boston-London, www.artechhouse.com, 2003, 1-447 pages.

* cited by examiner

*Primary Examiner* — Andre Pierre Louis

(57) ABSTRACT

A method is provided for simulating intermods of a signal including multiple carriers. The method includes receiving parameters of the signal, the parameters including a total number of carriers, a frequency of one carrier and a spacing between adjacent carriers; identifying multiple intermod combinations corresponding to a desired intermod order; and synthesizing multiple intermod envelopes corresponding to the intermod combinations according to multiple predetermined algorithms using at least one of the total number of carriers, the frequency of the one carrier, and the spacing between adjacent carriers. The predetermined algorithms including at least one predetermined algorithm corresponding to each intermod combination of the multiple intermod combinations.

16 Claims, 10 Drawing Sheets

Intermod Combination (1):

| F0 | F1 | F2 | F3 | F4 | Combination of Carriers |
|----|----|----|----|----|--------------------------|
| 1  | 1  | 1  | 1  | 1  | Amplitude (Number of Intermods) |
| 100| 101| 102| 103| 104| Frequency (MHz) |

*Fig. 6A*

Intermod Combination (1, -1, DC):

| F1,-1 | | |
| F2,-2 | | |
| F3,-3 | | |
| F4,-4 | | |
| F5,-5 | Combination | |
| 5     | Amplitude   | |
| 0     | Frequency   | |

*Fig. 6B*

Intermod Combination (1, -1):

| F-1,2 | F-1,3 | F-1,4 | F-1,5 | Combination |
|-------|-------|-------|-------|-------------|
| F-2,3 | F-2,4 | F-2,5 |       |             |
| F-3,4 | F-3,5 |       |       |             |
| F-4,5 |       |       |       |             |
| 4     | 3     | 2     | 1     | Amplitude   |
| 1     | 2     | 3     | 4     | Frequency   |

*Fig. 6C*

Intermod Combination (1, 1):

| F1,2 | F1,3 | F1,4<br>F2,3 | F1,5<br>F2,4<br>F3,3 | F2,5<br>F3,4 | F3,5 | F4,5 | Combination |
|---|---|---|---|---|---|---|---|
| 1 | 1 | 2 | 2 | 2 | 1 | 1 | Amplitude |
| 201 | 202 | 203 | 204 | 205 | 206 | 207 | Frequency |

*Fig. 6D*

Intermod Combination (2):

| F1,1 | F2,2 | F3,3 | F4,4 | F5,5 | Combination |
|---|---|---|---|---|---|
| 1 | 1 | 1 | 1 | 1 | Amplitude |
| 200 | 202 | 204 | 206 | 208 | Frequency |

*Fig. 6E*

Intermod Combination (-1, 2):

| F1,1,-5 | F1,1,-4 | F1,1,-3<br>F2,2,-5 | F1,1,-2<br>F2,2,-4 | F1,1,-1<br>F2,2,-3<br>F3,3,-5 | F2,2,-2<br>F3,3,-4<br>F4,4,-5 | F2,2,-1<br>F3,3,-3<br>F4,4,-4<br>F5,5,-5 | F3,3,-2<br>F4,4,-3<br>F5,5,-4 | F3,3,-1<br>F4,4,-2<br>F5,5,-3 | F4,4,-1<br>F5,5,-2 | F5,5,-1 | Combination |
|---|---|---|---|---|---|---|---|---|---|---|---|
| 1 | 1 | 2 | 2 | 3 | 3 | 3 | 3 | 2 | 2 | 1 | Amplitude |
| 96 | 97 | 98 | 99 | 100 | 101 | 102 | 103 | 104 | 105 | 106 | Frequency |

*Fig. 6F*

Intermod Combination (1, 2):

| Combination | Amplitude | Frequency |
|---|---|---|
| F1,1,2 | 1 | 301 |
| F1,1,3 F1,2,2 | 2 | 302 |
| F1,1,4 F1,2,3 F2,2,2 | 1 | 303 |
| F1,1,5 F1,2,4 F2,2,3 F1,3,3 | 3 | 304 |
| F1,2,5 F2,2,4 F2,3,3 | 2 | 305 |
| F2,2,5 F1,4,4 | 2 | 306 |
| F2,3,4 F3,3,3 | 2 | 307 |
| F3,3,4 F1,5,5 F3,4,4 | 3 | 308 |
| F2,5,5 | 1 | 309 |
| F3,3,5 F4,4,5 F3,5,5 | 2 | 310 |
| F4,5,5 | 1 | 311 |

*Fig. 6G*

Intermod Combination (1, 1, -1):

| Combination | Amplitude | Frequency |
|---|---|---|
| F1,2,-5 F1,3,-4 F1,4,-3 F1,5,-2 F2,3,-5 F2,4,-4 F2,5,-3 F3,4,-5 F3,5,-4 F4,5,-5 | 4 | 99 |
| F1,2,-4 F1,3,-3 F1,4,-2 F1,5,-1 F2,3,-4 F2,4,-3 F2,5,-2 F3,4,-4 F3,5,-3 F4,5,-4 | 6 | 100 |
| F1,2,-3 F1,3,-2 F1,4,-1 F2,3,-3 F2,4,-2 F2,5,-1 F3,4,-3 F3,5,-2 F4,5,-3 | 8 | 101 |
| F1,2,-2 F1,3,-1 F2,3,-2 F2,4,-1 F3,4,-2 F3,5,-1 F4,5,-2 | 8 | 102 |
| F1,2,-1 F2,3,-1 F3,4,-1 F4,5,-1 | 8 | 103 |
| F1,3,-5 F1,4,-4 F1,5,-3 F2,4,-5 F2,5,-4 F3,5,-5 | 6 | 104 |
| F1,4,-5 F1,5,-4 F2,5,-5 | 4 | 105 |
| F1,5,-5 F2,5,-5... | 2 | 106 |
| F1,-2,-5 | 1 | 97 |
| | 2 | 98 |
| | 1 | 107 |

*Fig. 6H*

Intermod Combination (1, 2):

| | F1,1,2 | F1,1,3<br>F1,2,2 | F1,1,4 | F1,1,5<br>F2,2,3<br>F1,3,3 | F2,2,4<br>F2,3,3 | F2,2,5<br>F1,4,4 | F3,3,4<br>F2,4,4 | F3,3,5<br>F1,5,5<br>F3,4,4 | F2,5,5 | F4,4,5<br>F3,5,5 | F4,5,5 | Combination |
|---|---|---|---|---|---|---|---|---|---|---|---|---|
| 1 | 2 | 1 | 3 | 2 | 2 | 2 | 3 | 1 | 2 | 1 | Amplitude |
| 301 | 302 | 303 | 304 | 305 | 306 | 307 | 308 | 309 | 310 | 311 | Frequency |

*Fig. 6I*

Intermod Combination (1, 2):

| | F1,1,2 | F1,1,3<br>F1,2,2 | F1,1,4 | F1,1,5<br>F2,2,3<br>F1,3,3 | F2,2,4<br>F2,3,3 | F2,2,5<br>F1,4,4 | F3,3,4<br>F2,4,4 | F3,3,5<br>F1,5,5<br>F3,4,4 | F2,5,5 | F4,4,5<br>F3,5,5 | F4,5,5 | Combination |
|---|---|---|---|---|---|---|---|---|---|---|---|---|
| 1 | 2 | 1 | 3 | 2 | 2 | 2 | 3 | 1 | 2 | 1 | Amplitude |
| 301 | 302 | 303 | 304 | 305 | 306 | 307 | 308 | 309 | 310 | 311 | Frequency |

*Fig. 6J*

SIMULATING INTERMODS OF HIGH CARRIER COUNT SIGNALS

BACKGROUND

Radio frequency (RF) and microwave amplifiers, as well as other non-linear devices, are common stages of nearly all types of modern communications systems, such as cell phones. Non-linear devices generate spurious and unwanted products (referred to as "spurious responses"). An input signal may include multiple carriers (or tones), each of which has a corresponding center frequency. The larger number of carriers, the greater the number of spurious responses generated by the non-linear device. The spurious responses include intermodulation disturbances between the carriers, which may be referred to as "intermods," including interactions among the harmonics of the carriers.

FIG. 1 includes two graphs showing the effects of a non-linear amplifier on multiple carriers. Referring to FIG. 1, spectral input 110 includes two input carriers 111 and 112, which are inputs to non-linear amplifier 120. The non-linear amplifier 120 generates spectral output 130, which includes two amplified carriers 131 and 132 at the same frequencies as the input carriers 111 and 112 but having greater amplitudes (from the amplification). The spectral output 130 also includes intermods 141-149 from $2^{nd}$ and $3^{rd}$ order intermodulation distortions (referred to as $2^{nd}$ and $3^{rd}$ order intermods), which are the products of the simultaneous amplification of the input carriers 111 and 112 in a non-linear device.

FIG. 2 is a similar graph showing the effects of a non-linear amplifier on ten input carriers. Referring to FIG. 2, spectral output 230 includes the ten amplified carriers, collectively indicated by reference number 231, resulting from ten corresponding input carriers (not shown), respectively. The spectral output 230 also includes two representative sets of $3^{rd}$ order intermods. First intermod set 241 corresponds to intermod combination (1, 1, −1) and second intermod set 242 corresponds to intermod combination (2, −1). The intermods of the first intermod set 241 may be totaled to provide first intermod envelope 243, and the intermods of the second intermod set 242 may be totaled to provide second intermod envelope 244. Other intermod combinations of the $3^{rd}$ order intermods (not shown in FIG. 2) include intermod combination (3), intermod combination (2, 1), and intermod combination (1, 1, 1), discussed below.

Notably, the spectral output 230 is only a small bandwidth of the entire output spectra. For clarity, the spectra near DC and all harmonics are not shown. Furthermore, the representative intermods are only due to $3^{rd}$ order intermodulation distortions, as mentioned above. Higher orders will create more intermods. The intermod combination (1, 1, −1) includes $3^{rd}$ order intermods generated due to three carriers (or tones) $F_i+F_j-F_k$, where F is a carrier frequency, i≠j and j≠k. The intermod combination (2, −1) includes $3^{rd}$ order intermods from two carriers $2F_i-F_j$, where i≠j. Multiple intermods appear at the same frequency, which is difficult to illustrate in FIG. 2. In the cable TV industry, for example, the total number of each of these single intermods at the same frequency is referred to as a total number of beats. Each single intermod will have that same amplitude if the frequency response of the amplifier is constant. Also, the amplitude of each of the first and second intermod envelopes 243 and 244 is maximum in the center of the band. In the cable TV industry, the $3^{rd}$ order intermod combination (1, 1, −1) is referred to as Carrier Triple Beats (CTB). Multiple intermods also appear at the same frequency. The total intermod level in the depicted example will be the sum of both the intermods from 3 tones (1, 1, −1) and 2 tones (2, −1).

Simulating large numbers of intermods is challenging due to the large amount of data created even for low order intermodulation distortions. Simulation time may be long, and quickly becomes impractical using conventional intermod simulation techniques due to large memory requirements, reduced simulation speed and limited display capabilities. Notably, the wireless industry continues to move to higher bandwidths and use more RF carriers. Also, in the cable TV industry, over a hundred channels are being amplified and processed by non-linear stages. These non-linear stages generate intermods that fall in-band as well as out-of-band. Understanding the spurious performance of systems processing hundreds of carriers is important to deliver quality cable TV products to customers.

SUMMARY

In a representative embodiment, a method is provided for simulating intermods of a signal comprising a plurality of carriers. The method includes receiving parameters of the signal, the parameters including a total number of carriers, a frequency of one carrier, and a spacing between adjacent carriers; identifying multiple intermod combinations corresponding to a desired intermod order; and synthesizing multiple intermod envelopes corresponding to the intermod combinations according to multiple predetermined algorithms using at least one of the total number of carriers, the frequency of the one carrier, and the spacing between adjacent carriers. The predetermined algorithms include at least one predetermined algorithm corresponding to each intermod combination of the multiple intermod combinations.

In another representative embodiment, a method is provided for simulating intermods of a signal comprising a plurality of carriers. The method includes synthesizing a plurality of intermod envelopes corresponding to a plurality of intermod combinations using a corresponding plurality of predetermined intermod frequency algorithms for generating independent frequency arrays for the plurality of intermod combinations, respectively, and a corresponding plurality of predetermined intermod amplitude algorithms for generating amplitude arrays for the plurality of intermod combinations, respectively.

In another representative embodiment, a signal generating device is provided for simulating intermods of a signal having multiple carriers. The device includes a processor configured to execute a computer program comprising the steps of: receiving parameters of the signal, including a total number of carriers, a frequency of a carrier, and a spacing between adjacent carriers; identifying multiple intermod combinations corresponding to a desired intermod order; and synthesizing multiple intermod envelopes corresponding to the intermod combinations according to multiple predetermined algorithms using at least one of the total number of carriers, the frequency of the carrier, and the spacing between adjacent carriers. The predetermined algorithms comprise at least one predetermined algorithm corresponding to each intermod combination of the multiple of intermod combinations.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 6A to 6J are charts depicting an example of calculating an intermod envelope for an intermod combination to determine an algorithm, according to a representative embodiment.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

According to various embodiments, algorithms are created and stored that will synthesize intermod envelopes for each intermod combination using simple parameters, such as a total number of carriers of a signal, a frequency of at least one carrier, a spacing between adjacent carriers, input power levels of the carriers, an intermod order, and specific intermod combinations (corresponding to the intermod order). The intermod envelopes are used in the simulation instead of all of the individual pieces of intermod spectrum that make up the totals or envelopes. It is assumed that the amplitudes of all the carriers are the same, and that the carriers are equally spaced from one another (which may be referred to a frequency carrier comb). Alternatively, the amplitudes may follow a predictable, identifiable pattern among the carriers.

Figure 1:
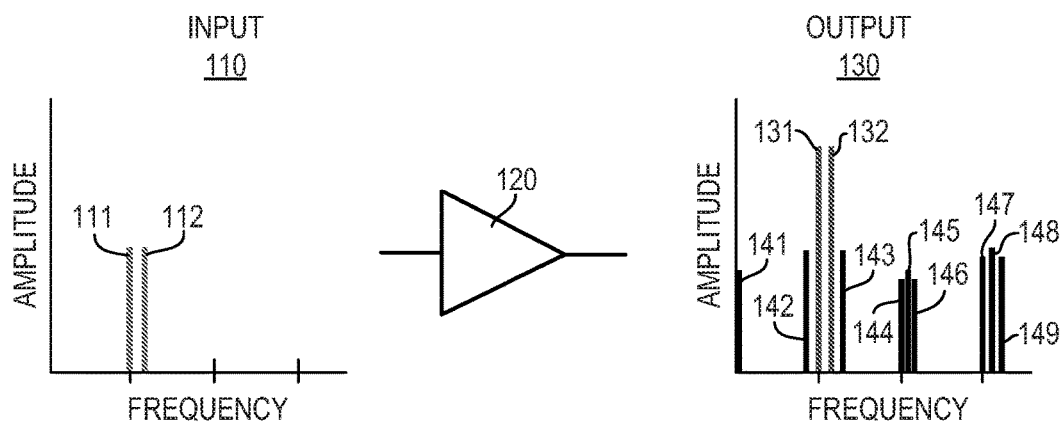
FIG. 1 includes two graphs showing general effects of a non-linear amplifier on multiple carriers.
Figure 2:
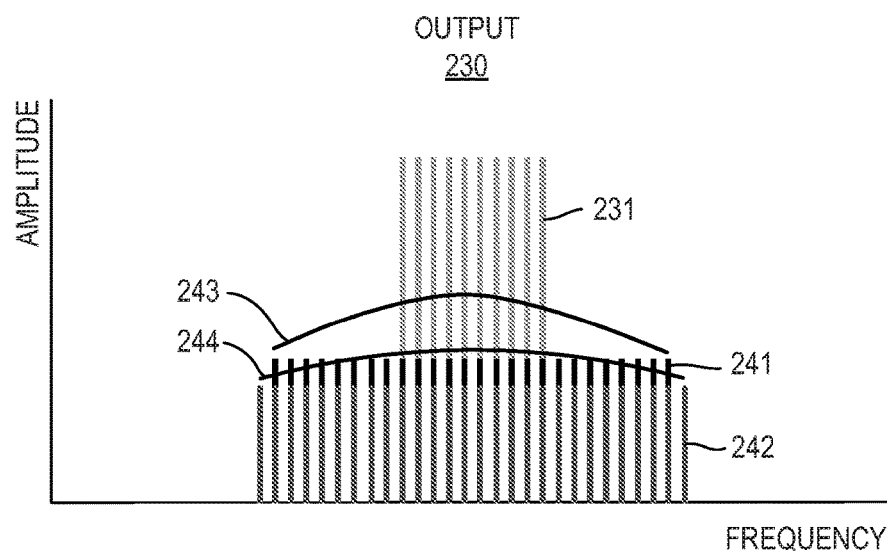
FIG. 2 includes a graph showing general effects of a non-linear amplifier on ten carriers, including representative intermods and intermod envelopes.
Figure 3:
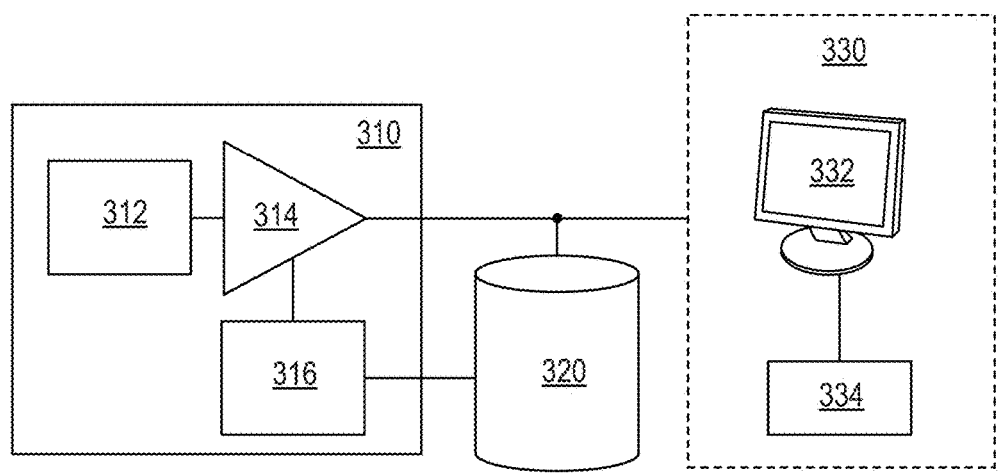
FIG. 3 is a simplified block diagram of an intermod simulation system, according to a representative embodiment.

FIG. 3 is a simplified block diagram of an intermod simulation system, according to a representative embodiment.

Referring to FIG. 3, intermod simulation system 300 includes processing unit 310, database or memory unit 320 and user interface unit 330. To provide the simulated intermods, the processing unit 310 may include a signal generator module 312, configured to provide a simulated input signal having multiple carriers, and a non-linear amplifier module 314, configured to amplify the simulated input signal to provide a simulated output signal (which would include intermods). The processing unit 310 further includes intermod envelope module 316 configured to determine intermod envelopes of the intermods of the simulated amplified output signal using predetermined algorithms stored in the memory unit 320. The user interface unit 330 enables a user to interact with the processing unit 310, and includes display 332 and input/output (I/O) device(s) 334. The input device may include a keyboard, a track ball, a mouse, a touch pad or touch-sensitive display, and the like. Any type of graphical user interface (GUI) may be included to interface the display 332 and the I/O device 334 with the processing unit 310. Information generated by the processing unit 310, such as the intermod envelopes and signal parameter information, may be visually displayed on the display 332.

The simulated amplified output signal includes amplified carriers and corresponding intermods. However, as discussed above, it is desirable to store and/or display only the amplified carriers and intermod envelopes of the various intermod combinations corresponding to a selected order of intermodulation distortion (intermod order), such as $2^{nd}$ or $3^{rd}$ order intermods, without having to first calculate the underlying intermods (which involves a prohibitive amount of processing for large numbers of carriers and/or higher order intermods). Accordingly, the intermod envelopes are determined directly by the intermod envelope module 316 using the predetermined algorithms, according to the method depicted in FIG. 4, below.

The memory unit 320 is configured to store the predetermined algorithms for determining the intermod envelopes, the predetermined algorithms being accessible by the intermod envelope module 316 of the processing unit 310, and to store the simulated amplified output signal provided by the non-linear amplifier module 314, including the carriers and intermod envelopes. The memory unit 320 may be any suitable type of tangible computer readable medium, including nonvolatile read only memory (ROM) and/or volatile random access memory (RAM), such as static RAM (SRAM), a disk drive, electrically programmable read-only memory (EPROM), electrically erasable and programmable read only memory (EEPROM), a CD, a DVD, a universal serial bus (USB) drive, and the like.

The processing unit 310 may be implemented using one or more processing devices, such as a processor, a microprocessor, a digital signal processor (DSP), one or more application specific integrated circuits (ASICs), one or more field-programmable gate arrays (FPGAs), or combinations thereof, using software, firmware, hard-wired logic circuits, or combinations thereof. The signal generator module 312, the non-linear amplifier module 314, and the intermod envelope module 316, which are depicted separately for convenience of explanation, may be implemented as software, firmware and/or hardware modules using the same or different processing devices. The processing unit 310 may have access to dedicated memory (not shown), comprising a tangible computer readable medium for storing operating software, modules, data and algorithms for executing the various embodiments described herein. Examples of a computer readable medium include various types of nonvolatile ROM and volatile RAM, such as SRAM, a disk drive, EPROM, EEPROM, a CD, a DVD, a USB drive, and the like.

Figure 4:
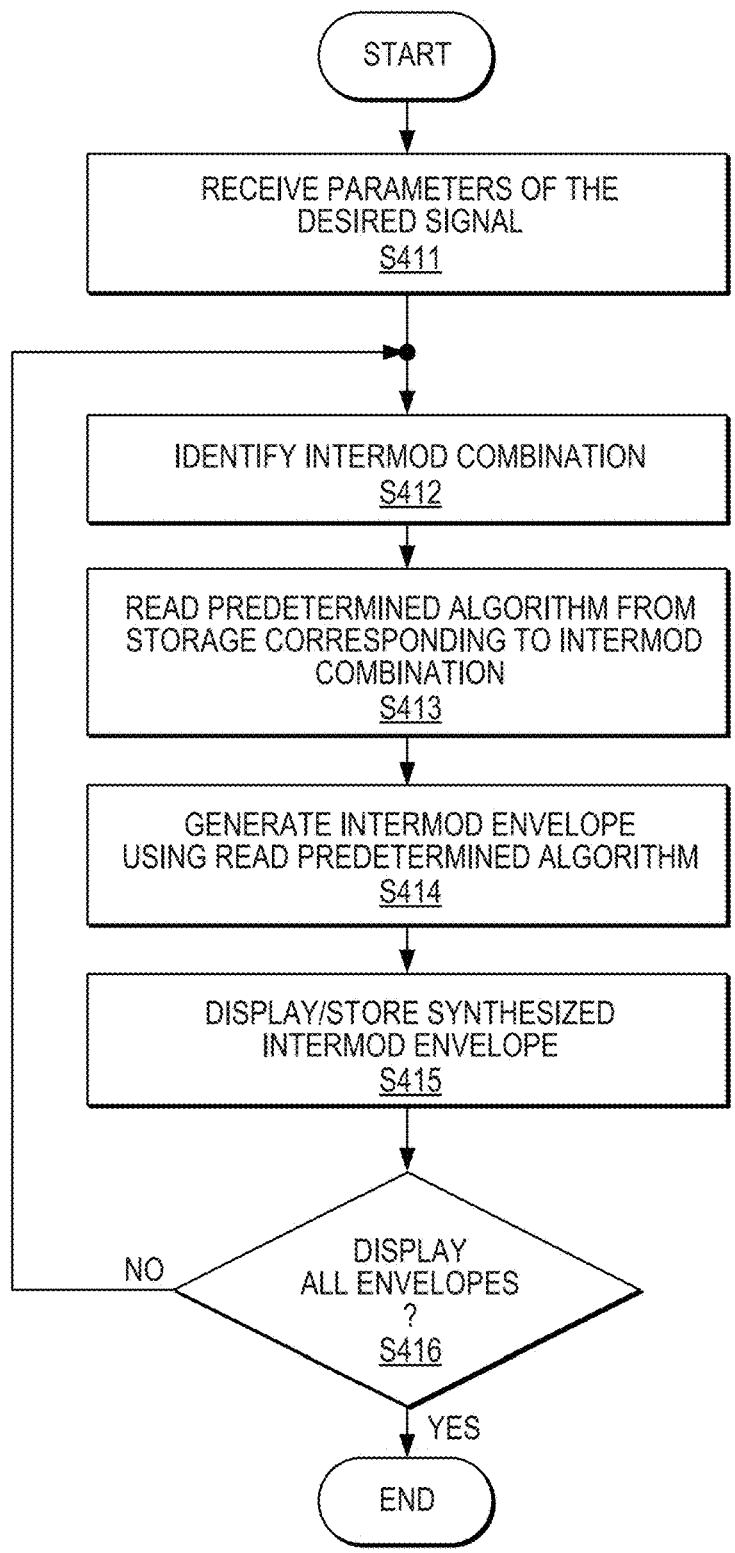
FIG. 4 is a flow diagram of a method for simulating intermods of a signal having multiple carriers, according to a representative embodiment.

FIG. 4 is a flow diagram of a method for simulating intermods of a signal having multiple carriers, according to a representative embodiment. Each of the operations depicted in FIG. 4 may be implemented by the processing unit 310.

Referring to FIG. 4, parameters of the desired signal are received in block S411. The received parameters may be input by a user through the I/O device 334, or by another processing device or test instrument. The parameters may include the total number of carriers of the signal, a frequency of at least one carrier, a spacing between adjacent carriers, and an input power level of the carriers, for example, so that the signal may be accurately simulated. In an embodiment, the spacing between the adjacent carriers is the same. Therefore, for example, the at least one carrier frequency may be the lowest (or highest) frequency of the multiple carriers, and the other carrier frequencies may be derived by adding (or subtracting) the spacing between adjacent carriers. The method is able to handle large numbers of carriers, e.g., greater than five, and even up to 100 or more carriers, without requiring excessive and time consuming data collection and processing (of all the intermods corresponding to all the carriers). The frequency of the at least one carrier may be that of a first (lowest frequency) carrier, so that the frequencies of the other carriers may be determined using the spacing between adjacent carriers. Of course the frequencies of the carriers may be determined by various means without departing from the scope of the present teachings. For example, the last (highest frequency) carrier may be provided, or the user may simply input the frequency of each carrier.

In block S412, the intermod combinations corresponding to a desired intermod order are identified. The desired intermod order is at least a $2^{nd}$ order intermod. For example, if $3^{rd}$ order intermods are desired, the identified intermod combinations include intermod combination (3), intermod combination (1, 1, 1), intermod combination (1, 1, −1), intermod combination (1, 2) (which is the same as intermod combination (2, 1)), and intermod combination (−1, 2). In an embodiment, all lesser intermod orders are also identified along with the desired intermod order. So, in the example of the $3^{rd}$ order intermods, the $2^{nd}$ order intermods are also identified, which include intermod combination (2), intermod combination (1, −1, DC), intermod combination (1, −1), and intermod combination (1, 1). The only limitation on the number of the desired intermod order is the range of predetermined algorithms previously determined and saved in the memory unit 320.

The intermod combinations are generally known to one of ordinary skill in the art. For example, for a $2^{nd}$ order intermod, the intermod combination (2) includes frequencies and amplitudes based on doubling each carrier; the intermod combination (1, −1, DC) includes frequencies and amplitudes based on subtracting each carrier from itself; the intermod combination (1, −1) includes frequencies and amplitudes based on subtracting each carrier from each of the other carriers; and the intermod combination (1, 1) includes frequencies and amplitudes based on adding each carrier to each of the other carriers. For a $3^{rd}$ order intermod, the intermod combination (3) includes frequencies and amplitudes based on tripling each carrier; the intermod combination (1, 1, 1) includes frequencies and amplitudes based on adding each carrier to two of each of the other carriers; the intermod combination (1, 1, −1) includes frequencies and amplitudes based on adding and subtracting each carrier to and from each other carrier; the intermod combination (1, 2) includes frequencies and amplitudes based on adding each carrier to twice each of the other carriers; and the intermod combination (−1, 2) includes frequencies and amplitudes based on subtracting each carrier from twice each of the other carriers.

In the depicted embodiment, each intermod combination is identified and processed separately before the next intermod combination is identified and processed. Of course, the intermod combination may be identified at the same time or in various orders without departing from the scope of the present teachings.

In block S413, a predetermined algorithm corresponding to the identified intermod combination is read from the memory unit 320. Using the read predetermined algorithm, the intermod envelope corresponding to the intermod combination is generated by the intermod envelope module 316 in block S414, e.g., using the total number of carriers, the frequencies of the carriers, and the spacing between adjacent carriers. A predetermined algorithm is stored for each intermod combination. The predetermined algorithm corresponding to each intermod combination includes a predetermined intermod frequency algorithm for generating an independent frequency array for the intermod combination, and a predetermined intermod amplitude algorithm for generating an amplitude array for the intermod combination. The predetermined intermod amplitude algorithm for each intermod combination uses the total number of carriers, and may be determined by identifying patterns in intermod amplitude arrays calculated using multiple numbers of total carriers and whether the number of total carriers is even or odd, and creating the predetermined intermod amplitude algorithm to capture the patterns in the calculated intermod amplitude arrays. An illustrative method of determining the predetermined algorithms is discussed below with reference to FIGS. 5 and 6, according to a representative embodiment.

The intermod envelopes may be displayed on the display 332 and/or stored in the memory unit 320 in block S415, e.g., along with spectra depicting the amplified carriers. It is determined in block S416 whether all of the intermod envelopes corresponding to the selected intermod order (e.g., the $2^{nd}$ and $3^{rd}$ intermod orders) have been displayed. When all of the intermod envelopes have not yet been displayed (block S416: No), the process returns to block S412 to identify the next intermod combination. Blocks S414 through S416 are then repeated. When all of the intermod envelopes have been displayed (block S416: Yes), the process ends. The predetermined intermod algorithms provide intermod envelopes, each of which includes separately determined independent frequency array and intermod amplitude array. Therefore, each predetermined intermod algorithm includes an independent frequency algorithm and amplitude algorithm. In order to understand how the independent frequency algorithms and the amplitude algorithms are determined (for storing in the memory unit 320), it is helpful to address how intermods are determined, generally.

As a practical matter, the power of an output signal of any amplifier will not increase linearly forever since it will eventually reach a power level where the output power no longer increases with increases in the power of the input signal. This relationship may be represented with an nth order polynomial, such as Equation (1), where n is the polynomial order:

$$Y_n(x) = \alpha_0 + \alpha_1 x + \alpha_2 x^2 + \alpha_3 x^3 + \ldots + \alpha_n x^n \qquad (1)$$

An input signal x(t) having M carriers may be represented by Equation (2):

$$x(t) = \sum_{m=1}^{M} A_m \cos(\omega_m t) \quad (2)$$

Euler's formula is provided by Equation (3):

$$\cos(\omega t) = \frac{e^{j\omega t} + e^{-j\omega t}}{2} \quad (3)$$

Using Euler's formula, the input signal x(t) having M carriers may be represented by Equation (4), where $m \neq 0$ and $A_m = A^*_{-m}$:

$$x(t) = \frac{1}{2} \sum_{m=-M}^{M} A_m e^{-j\omega_m t} \quad (4)$$

Substituting Equation (4) into Equation (1), above, the output signal $Y_n(x)$ may be provided by Equation (5):

$$Y_n(x) = \left[ \frac{1}{2} a_n \sum_{m=-M}^{M} A_m e^{-j\omega_m t} \right]^n \quad (5)$$

Expanding the summation and collecting terms provides Equation (6), the frequency components of which are all possible combinations of the input frequency $\omega_m$ of each of the M carriers, as shown by Equation (7):

$$Y_n(x) = \frac{1}{2^n} a_n \sum_{m1=-M}^{M} \ldots \sum_{mn=-M}^{M} A_{m1} \ldots A_{mn} e^{j(\omega_{m1}|\ldots|\omega_{mn})t} \quad (6)$$

$$\omega_m = \quad (7)$$
$$\omega_{m1} + \ldots + \omega_{mn} = k_{-M}\omega_{-M} + \ldots + k_{-1}\omega_{-M} + k_1\omega_1 + \ldots + k_M\omega_M$$

$\text{mix}_{n,M} = (k_{-M}, \ldots, k_{-1}, k_1, \ldots, k_M)$ is the nth order mixing vector that must meet the conditions in Equation (8):

$$\text{Order}_M = |k_{-M}| + \ldots + |k_{-1}| + |k_1| + \ldots + |k_M| = \sum_{m=-M}^{M} k_m| \quad (8)$$

The final output voltages $Vout_{n,m}$ of the intermods based on the intermod order is provided by Equation (9):

$$Vout_{n,M} = \frac{1}{2^n} a_n \left( \frac{n!}{k_1! k_2! \ldots k_M!} \right) Vin_M \quad (9)$$

To convert the output of Euler's formula in Equation (3) back to a cosine, the final output voltages $Vout_{n,m}$ must be multiplied by a factor of two. Therefore, Equation (9) becomes Equation (10):

$$Vout_{n,M} = \frac{1}{2^{n-1}} \alpha_n \left( \frac{n!}{k_1! k_2! \ldots k_M!} \right) Vin_M \quad (10)$$

The input voltages $Vin_M$ is given by Equation (11), where $m \neq 0$ and $A_{-m} = A^*_m$:

$$Vin_M = k_{-m} A_M^* + \ldots + k_{-1} A_1^* + k A_1 + \ldots + k_M A_M \quad (11)$$

Using Equation (10), the intermod amplitude coefficient becomes as provided by Equation (12):

$$\text{Intermod Amplitude } Coeff_{n,M} = \frac{1}{2^{n-1}} a_n \left( \frac{n!}{k_1! k_2! \ldots k_M!} \right) \quad (12)$$

In the case where each input carrier has the same amplitude, the input voltage Vin may be simplified, as shown by Equation (13):

$$Vin \text{ equal}_M = A^*(k_{-M} + \ldots + k_{-1}) + A(k + \ldots + k_M) \quad (13)$$

If all carriers have the same amplitudes, then for intermods having the same intermod amplitude coefficient, the output voltages $Vout_{n,m}$ will be the same regardless of what the frequency is.

Table 1 shows an example of a mixing vector with its corresponding intermod order and amplitude for two carriers (tones), having frequencies $\omega_1$ and $\omega_2$ and amplitudes $A_1$ and $A_2$, respectively, into a $3^{rd}$ order polynomial. Only positive frequencies are considered, and it is assumed that $\omega_2 > \omega_1$ and $2\omega_1 > \omega_2$.

TABLE 1

| No. | $-\omega_2$ | $-\omega_1$ | $-\omega_1$ | $-\omega_2$ | Order | Frequency | Amplitude | Type of Response |
|---|---|---|---|---|---|---|---|---|
| 1 | 0 | 0 | 1 | 0 | 1 | $\omega_1$ | $\alpha_1 A_1$ | Linear Gain |
| 2 | 0 | 0 | 0 | 1 | 1 | $\omega_2$ | $\alpha_1 A_2$ | Linear Gain |
| 3 | 0 | 1 | 1 | 0 | 2 | $\omega_1 - \omega_2$ | $\alpha_2 A_1^* A_1$ | Shift of Bias |
| 4 | 1 | 0 | 0 | 1 | 2 | $\omega_2 - \omega_2$ | $\alpha_2 A_2^* A_2$ | Shift of Bias |
| 5 | 0 | 0 | 1 | 1 | 2 | $\omega_1 + \omega_2$ | $\alpha_2 A_1 A_2$ | $2^{nd}$ Order Distortion |
| 6 | 0 | 0 | 2 | 0 | 2 | $2\omega_1$ | ½ $\alpha_2 A_1^2$ | $2^{nd}$ Harmonic |
| 7 | 0 | 0 | 0 | 2 | 2 | $2\omega_2$ | ½ $\alpha_2 A_2^2$ | $2^{nd}$ Harmonic |
| 8 | 0 | 1 | 0 | 1 | 2 | $\omega_2 - \omega_1$ | $\alpha_2 A_1^* A_2$ | $2^{nd}$ Order Distortion |
| 9 | 0 | 0 | 3 | 0 | 3 | $3\omega_1$ | ¼ $\alpha_3 A_1^3$ | $3^{rd}$ Harmonic |
| 10 | 0 | 0 | 0 | 3 | 3 | $3\omega_2$ | ¼ $\alpha_3 A_2^3$ | $3^{rd}$ Harmonic |
| 11 | 0 | 1 | 1 | 1 | 3 | $\omega_1 - \omega_1 + \omega_2$ | ¾ $\alpha_3 A_1^* A_1 A_2$ | Cross Mod and Desens |
| 12 | 1 | 0 | 1 | 1 | 3 | $\omega_1 - \omega_2 + \omega_2$ | ¾ $\alpha_3 A_2^* A_1 A_2$ | Cross Mod and Desens |
| 13 | 0 | 0 | 2 | 1 | 3 | $2\omega_1 + \omega_2$ | ¾ $\alpha_3 A_1^2 A_2$ | $3^{rd}$ Order Distortion |
| 14 | 0 | 0 | 1 | 2 | 3 | $\omega_1 + 2\omega_2$ | ¾ $\alpha_3 A_1 A_2^2$ | $3^{rd}$ Order Distortion |
| 15 | 0 | 1 | 2 | 0 | 3 | $2\omega_1 - \omega_1$ | ¾ $\alpha_3 A_1^* A_1^2$ | AM/AM and AM/PM |

TABLE 1-continued

| No. | $-\omega_z$ | $-\omega_1$ | $-\omega_1$ | $-\omega_z$ | Order | Frequency | Amplitude | Type of Response |
|---|---|---|---|---|---|---|---|---|
| 16 | 0 | 1 | 0 | 2 | 3 | $2\omega_2 - \omega_1$ | $\tfrac{3}{4}\,\alpha_3 A_1^{*} A_2^2$ | $3^{rd}$ Order Distortion |
| 17 | 1 | 0 | 2 | 0 | 3 | $2\omega_1 - \omega_2$ | $\tfrac{3}{4}\,\alpha_3 A_2^{*} A_1^2$ | $3^{rd}$ Order Distortion |
| 18 | 1 | 0 | 0 | 2 | 3 | $2\omega_2 - \omega_2$ | $\tfrac{3}{4}\,\alpha_3 A_2^{*} A_2^2$ | AM/AM and AM/PM |

Table 1 depicts a relatively simple case of converting two carriers into a 3rd order non-linearity. See, e.g., Pedro et al., INTERMODULATION DISTORTION IN MICROWAVE AND WIRELESS CIRCUITS (Boston, London, Artech House, 2003), p. 23. Of course, as the number of carriers increases from two, the number of intermods increases drastically.

In order to synthesize the intermod envelopes directly, as in block S413 above, the corresponding predetermined intermod algorithms must be able to calculate these intermod envelopes using a conventional approach by considering every intermod and adding them together to come up with the total or the intermod envelope. Once the intermod envelopes are created for a specific intermod combination, patterns in the empirical envelope data may be extracted. These patterns will be used to create the predetermined intermod algorithms used to synthesize the intermod envelopes based on various parameters, such as the signal parameter(s) (received in block S411), including total number of carriers, frequency of at least one carrier, spacing between adjacent carriers, and/or input power levels, and the intermod order for the specific intermod combination.

Using mixing vectors is complicated and not very efficient. Equations contained in Table 2 and Table 3 below are used to create intermod counts (or beats) for each intermod combination for $2^{nd}$ and $3^{rd}$ order intermods. Each value in the summation represents a single intermod. The amplitude for each intermod is considered to be one, for simplicity. Thus, every time another intermod falls at the same frequency, the amplitude of that intermod is increased by one, which provides the relative amplitude shape for the corresponding intermod envelope. This is all that is required here since exact amplitudes, if desired, may be determined by other factors, as given by Equations (1) through (13), above. The process may be repeated for each intermod combination to generate all the corresponding intermod envelopes.

The following tables show the (manually calculated) frequencies of the intermods for M carriers, where Table 2 provides $2^{nd}$ order intermod frequencies and Table 3 provides $3^{rd}$ order intermod frequencies.

TABLE 2

| Intermod Comb. | Independent Frequency Equation |
|---|---|
| 2 | $\text{indepFreq}(2) = 2\text{Carrier}_{1st} + \sum_{i=1}^{M}(2i-2)\text{Carrier}_{Spacing}$ |
| 1, -i DC | $\text{indepFreq}(1,-1\text{ DC}) - 0$ |
| 1, -1 | $\text{indepFreq}(1,-1) = \sum_{i=1}^{M}\sum_{j=i+1}^{M}(j-i)\text{Carrier}_{Spacing}$ |
| 1, 1 | $\text{indepFreq}(1,1) = 2\text{Carrier}_{1st} + \sum_{i=1}^{M}\sum_{j=i|1}^{M}(i+j-2)\text{Carrier}_{Spacing}$ |

TABLE 3

| Inter. Comb. | Independent Frequency Equation |
|---|---|
| 3 | $\text{indepFreq}(3)_i = 3\text{Carrier}_{1st} + \sum_{i=1}^{M}(3i-3)\text{Carrier}_{Spacing}$ |
| 1, 1, 1 | $\text{indepFreq}(1,1,1) = 3\text{Carrier}_{1st} + \sum_{i=1}^{M}\sum_{j=i+1}^{M}\sum_{k=j+1}^{M}(i+j+k-3)\text{Carrier}_{Spacing}$ |
| 1, 1, -1 | $\text{indepFreq}(1,1,-1)_{ijk} = \text{Carrier}_{1st} + \sum_{i=1}^{M}\sum_{j=i+1}^{M}\sum_{k=1}^{M}(i+j-k-1)\text{Carrier}_{S}$ |
| 1, 2 | $\text{indepFreq}(1,2) = 3\text{Carrier}_{1st} + \sum_{i=1}^{M}\sum_{j=i+1}^{M}(2i+j-3)\text{Carrier}_{Spacing}$ and $3\text{Carrier}_{1st} + \sum_{i=1}^{M}\sum_{j=i+1}^{M}(i+2j-3)\text{Carrier}_{Spacing}$ |
| -1, 2 | $\text{indepFreq}(-1,2) = \text{Carrier}_{1st} + \sum_{i=1}^{M}\sum_{j=1}^{M}(2i-j-1)\text{Carrier}_{Spacing}$ |

Tables 2 and 3 show only $2^{nd}$ and $3^{rd}$ orders of intermodulation distortion. Higher intermod orders are not as common, but do exist. The Independent Frequency Equations of the higher intermod orders and corresponding predetermined intermod algorithms may be calculated in substantially the same manner as $2^{nd}$ and $3^{rd}$ orders intermods discussed herein. Once the intermod envelope for each intermod combination is calculated, as shown in Tables 2 and 3, the intermod envelopes can be analyzed and then synthesized through routines that do not require overhead of nested summations.

Figure 5:
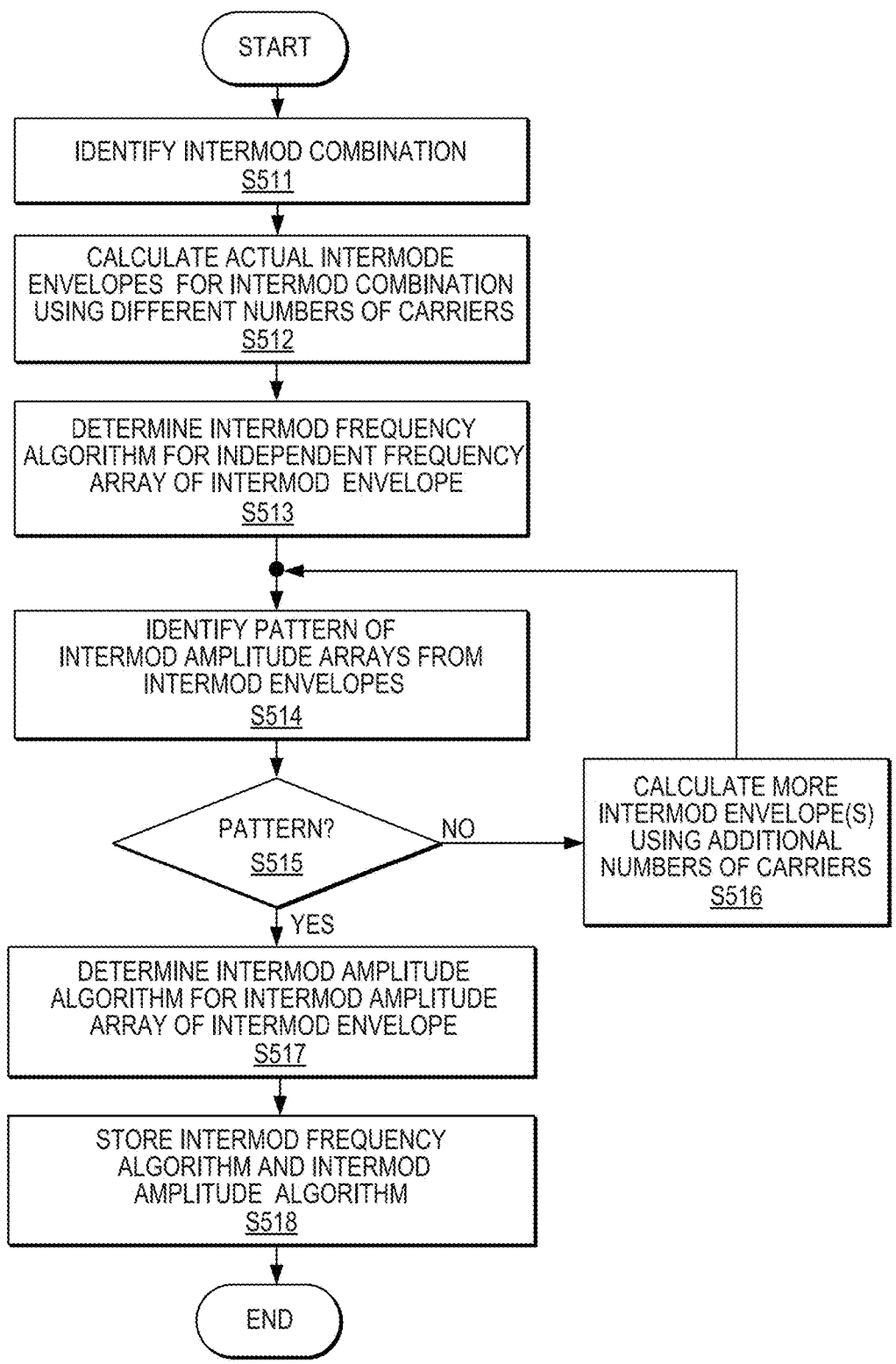
FIG. 5 is a flow diagram of a method for determining algorithms corresponding to intermod combinations of a signal having multiple carriers, according to a representative embodiment.

FIG. 5 is a flow diagram of a method for determining a predetermined algorithm corresponding to an intermod combination for a signal having multiple carriers, according to a representative embodiment. As mentioned above, each of the predetermined algorithms includes a predetermined intermod frequency algorithm for generating an independent frequency array (indepFreq) and a predetermined intermod amplitude algorithm for generating an amplitude array (specAmp) for the intermod combination.

Referring to FIG. 5, the intermod combination is identified in block S511. The number and types of intermod combinations are a function of the intermod order, as discussed above. So, for example, the intermod combinations for which predetermined algorithms must be developed for a $2^{nd}$ order intermod are intermod combinations (2), (1, −1, DC), (1, −1), and (1, 1). In block S512, multiple intermod envelopes are calculated for the intermod combination identified in block S511 using input signals having different numbers of carriers, e.g., 3 to 10 carriers, respectively. Both odd and even numbers of carriers are examined.

In block S513 an intermod frequency algorithm is determined for the independent frequency array of the intermod envelope for the intermod combination identified in block S511. Generally, all independent frequency arrays may be summarized by formulas, which are known to one of ordinary skill in the art and/or may be easily determined based on one or more of the intermod envelopes calculated in block S512. Therefore, determining the intermod frequency algorithm may simply include identifying the corresponding formula and including it in the predetermined algorithm.

The intermod amplitude algorithm is determined for the intermod amplitude array of the intermod envelope in blocks S514 through S517. In block S514, an attempt is made to identify a pattern of the intermod amplitude arrays emerging from the intermod envelopes calculated in block S512 based on at least the number of carriers. The emerging pattern may also be based on whether the number of carriers is even or odd, where different patterns may emerge for an even number of carriers and an odd number of carriers. It is determined in block S515 whether such a pattern has been identified. When a pattern is identified (block S515: Yes), an intermod amplitude algorithm is created in block S517 that will synthesize the intermod amplitude arrays, for example, based on the number of carriers. Generally, this consists of in-band and out-of-band pieces, where the in-band pieces are directed to intermods having frequencies the same as the original carrier frequencies and the out-of-band pieces are directed to intermods having frequencies different from the original carrier frequencies. For example, referring to FIG. 6F, discussed below, the representative intermods having frequencies of 100 MHz to 104 MHz are in-band and the remaining frequencies (96 MHz to 99 MHz and 105 MHz to 108 MHz) are out-of band. When creating the intermod amplitude algorithms, there generally is a pattern for the out-of-band piece that may differ from the in-band piece. That is, although the end result is a single intermod amplitude algorithm, there may be different patterns emerging for the in-band and out-of-band pieces, for a particular intermod envelope.

When a pattern is not identified (block S515: No), this means that a higher number of carriers needs to be examined. Accordingly, the process proceeds to block S516, in which one or more additional intermod envelopes are calculated for the intermod combination using input signals having greater numbers of carriers than originally calculated in block S512, respectively. The process then repeats blocks S514 through S516, as needed, until a pattern is identified and a corresponding intermod amplitude algorithm is created in block S517 that accurately synthesizes the intermod amplitude array for any number of carriers.

Notably, in some cases, the intermod amplitude array is relatively simple and may be summarized by formula, as in the case of the independent frequency array. For example, in a $2^{nd}$ order intermod, the intermod amplitude array for the intermod combination (2) is simply equal to one regardless of the number of carriers, and the intermod amplitude array for the intermod combination (1, −1, DC) is simply equal to the number of carriers (i.e., the carrier count). However, when such a formula is not possible, the intermod amplitude algorithm is essentially determined empirically by calculating multiple amplitude arrays using increasing numbers of carriers until a pattern emerges, which can be identified and captured in a corresponding intermod amplitude algorithm, as discussed above.

In block S518, the intermod frequency algorithm determined in block S512 and the intermod amplitude algorithm determined in blocks S514 to S517 are stored, e.g., in the memory unit 320, as the predetermined algorithm for the particular intermod combination identified in block S511. This predetermined algorithm may then be called upon to directly synthesize the intermod envelope for the intermod combination in block S413 of FIG. 4 for any number of carriers, i.e., without having to separately perform calculations of the intermods and then adding or combining the calculated intermods to provide the intermod envelope. The process depicted in FIG. 5 may be repeated for each intermod combination for the order of interest.

FIGS. 6A to 6J are charts depicting an example of block S512, in which 2nd and 3rd order intermods are generated for a signal having five carriers. The frequency of the first carrier (the start frequency) is 100 MHz, and the carrier spacing between adjacent carriers is 1 MHz. Each of FIGS. 6A to 6J corresponds to a particular intermod combination, where FIGS. 6A to 6E are $2^{nd}$ order intermod combinations and FIGS. 6F to 6J are $3^{rd}$ order intermod combinations. The top set of values (preceded by "F") shows the combinations of carriers for generating an intermod at a particular frequency. For example, (F−3, 4) in FIG. 6C means that an intermod was created by the fourth carrier minus the third carrier. The middle set of values provides the amplitudes (i.e., the number of intermods or beats at a given frequency) for the intermod amplitude array (specAmp). The bottom set of values provides the frequencies for the independent frequency array (indepFreq). The values in FIGS. 6A to 6J are calculated as part of determining the corresponding predetermined algorithms for the depicted intermod combinations.

Examples of the $2^{nd}$ order intermods are provided below. Each of the algorithms represents a single data point in the independent frequency array (indepFreq) or the intermod amplitude array (specAmp) of the intermod envelope. These algorithms are stored, e.g., in the memory unit 320, for synthesizing the corresponding intermod envelopes in block S413 of FIG. 4.

More particularly, the predetermined intermod frequency algorithm and intermod amplitude algorithm corresponding to the intermod combination (2) are provided by Equations (14) and (15), where indepFreqCount=$\text{Carrier}_{Count}$:

$$indepFreq(2)_i = 2\text{Carrier}_{1st} + \sum_{i=1}^{indepFreqCount} (2i-2)\text{Carrier}_{Spacing} \quad (14)$$

$$specAmp(2)_i = 1 \quad (15)$$

The predetermined intermod frequency algorithm and intermod amplitude algorithm corresponding to the intermod combination (1, −1, DC) are provided by Equations (16) and (17), respectively:

$$indepFreq(1,-1DC)=0 \quad (16)$$

$$specAmp(1,-1DC)=\text{Carrier}_{Count} \quad (17)$$

The predetermined intermod frequency algorithm and intermod amplitude algorithm corresponding to the intermod combination (1, −1) are provided by Equations (18) and (19), respectively, where indepFreqCount=$\text{Carrier}_{Count}$−1:

$$indepFreq(1,-1)_i = \sum_{i=1}^{indepFreqCount} i\text{Carrier}_{Spacing} \quad (18)$$

$$specAmp(1,-1)_i = \sum_{i=1}^{indepFreqCount} \text{Carrier}_{Count} - i \quad (19)$$

The predetermined intermod frequency algorithm corresponding to the intermod combination (1, 1) is provided by Equation (20)), where indepFreqCount=2*$\text{Carrier}_{Count}$−3:

$$indepFreq(1,1)_i = 2\text{Carrier}_{1st} + \sum_{i=1}^{indepFreqCount} i\text{Carrier}_{Spacing} \quad (20)$$

Figure 7:
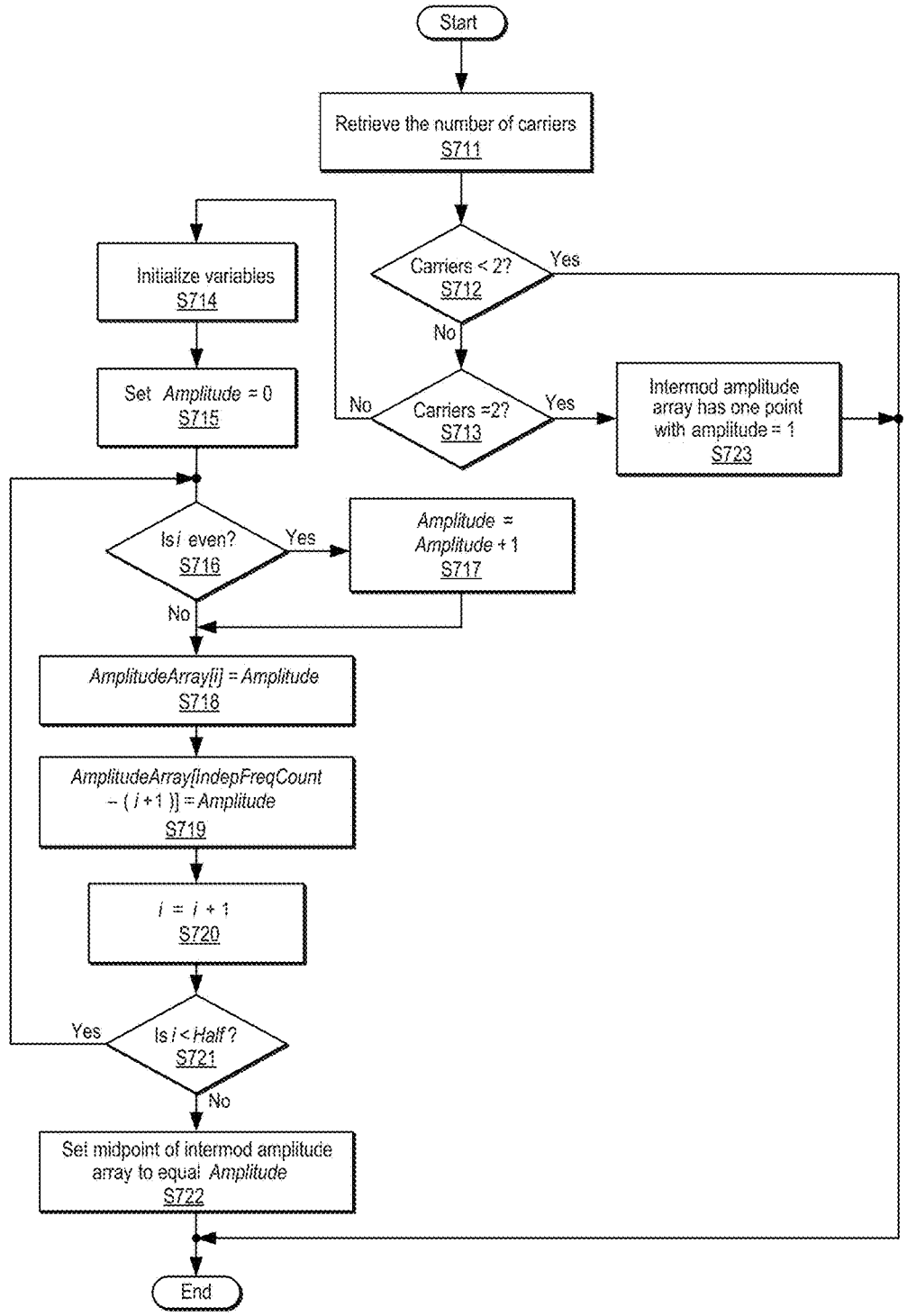
FIG. 7 is a flow diagram corresponding to an intermod amplitude algorithm for intermod combination (1, 1), according to a representative embodiment.

Notably, for the intermod combination (1, 1), the intermod amplitude algorithm cannot be represented by a formula, as is the case for intermod combinations (2), (1, −1, DC), and (1, −1), above. Therefore, the intermod amplitude algorithm is determined according to the process depicted in FIG. 5. FIG. 7 is a flow diagram corresponding to the resulting intermod amplitude algorithm corresponding to the intermod combination (1, 1), according to a representative embodiment.

Referring to FIG. 7, the first step of the intermod amplitude algorithm is to retrieve the number of carriers in block S711. In block S712, it is determined whether the number of carriers is less than 2. When the number of carriers is less than 2 (block S712: Yes), the process ends as there is no need to create this intermod. When the number of carriers is not less than 2 (block S712: No), it is determined whether the number of carriers is equal to 2 in block S713. When the number of carriers is equal to 2 (block S713: Yes), it is determined in block S723 that the intermod amplitude array has only one point and its amplitude is one.

When the number of carriers is not equal to 2 (block S713: No), the process proceeds to block S714 for initializing variables. In particular, the variable Half is set to indepFreqCount divided by two (only half of the intermod envelope values need to be calculated since the intermod envelopes are always symmetric, except for intermod envelopes near DC), and variable i is set to zero. Also, an intermod amplitude array is created that represents the amplitude portion of the envelope called AmplitudeArray, which is the same length as the independent frequency array. In this case, indepFreqCount=2*$\text{Carrier}_{Count}$−3. The intermod amplitude array is initialized to contain all zeros.

Amplitude is set equal to zero in block S715. In block S716, it is determined whether i is an even number. When i is an even number (block S716: Yes), then variable Amplitude is incremented by one in block S717, and when i is not an even number (block S716: No), then variable Amplitude remains the same. In block S718, intermod amplitude array position i is set to equal Amplitude, or AmplitudeArray[i]=Amplitude. Because the intermod envelope is symmetric, as mentioned above, the amplitude on the other end of the intermod envelope is set to the same amplitude value as Amplitude, or AmplitudeArray[IndepFreqCount−(i+1)]=Amplitude, in block S719.

The variable i is incremented by one in block S720, and compared to the value of Half in block S721. When i is less than Half (operation S721: Yes), the process returns to block S716, and the operations of blocks S716 to S721 are repeated. When i is not less than Half (operation S721: No), the process proceeds to block S722 for setting the midpoint (center value) of the intermod amplitude array. In particular, the midpoint of the intermod amplitude array is set equal to the value of Amplitude, or AmplitudeArray [Half]=Amplitude. Notably, when the number of carriers is even, then the last known value of Amplitude is incremented by one before setting the midpoint of the intermod amplitude. Thus, the intermod amplitude array for the intermod combination (1, 1) is provided.

Accordingly, intermod envelopes corresponding to the $2^{nd}$ order intermods are provided using the intermod frequency algorithms and corresponding intermod amplitude algorithms discussed above. These intermod envelopes are determined without actually calculating the individual intermods themselves.

Figure 8:
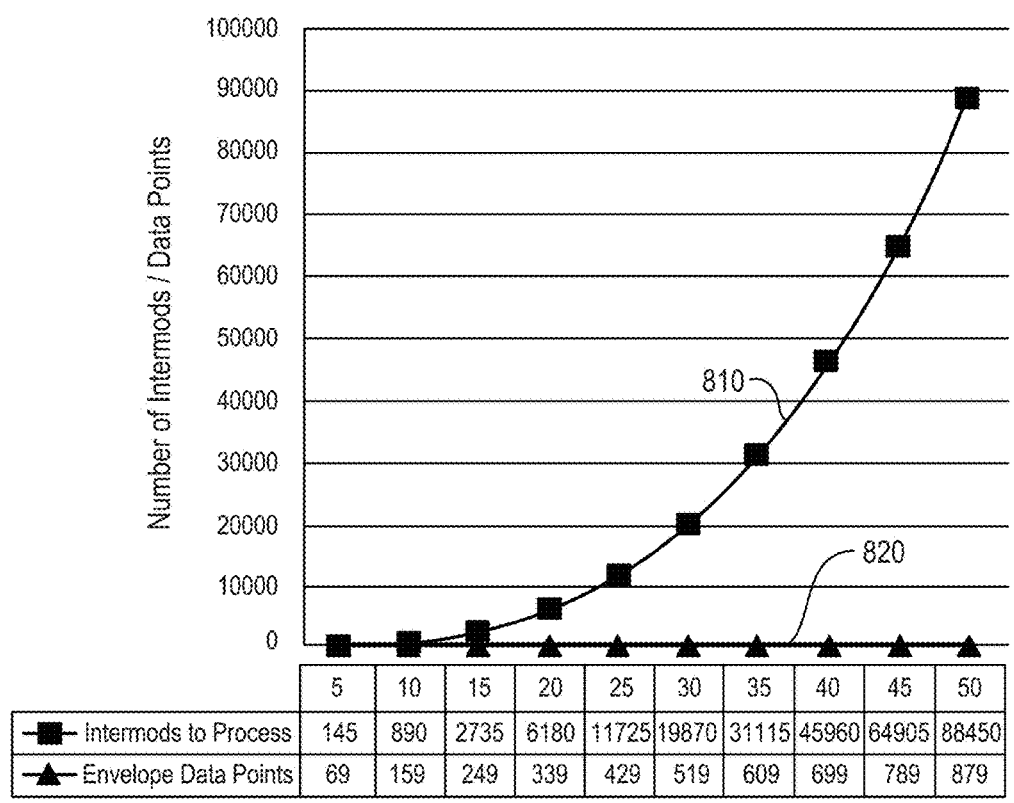
FIG. 8 is a graph showing performance comparison between conventional intermod simulation techniques and intermod simulation according to representative embodiments.

FIG. 8 is a graph showing performance comparison between a conventional intermod simulation technique and intermod simulation according to representative embodiments.

Referring to FIG. 8, the horizontal axis shows the total number of carriers in a signal, ranging from 5 to 50 carriers. The vertical axis shows the total number of intermods generated in the conventional intermod simulation technique and the number of intermod envelope data points generated according to the representative embodiment. As shown by curve 810, the number of intermods required for the intermod simulation increases substantially exponentially as the number of carriers increases, according to the conventional intermod simulation technique. For example, for five carriers, the conventional intermod simulation technique generates only 145 intermods, while for 50 carriers, the conventional intermod simulation technique generates 88,450 intermods.

In comparison, the intermod simulation technique according to a representative embodiment generates only intermod envelope data points according to the predetermined algorithms, which already incorporate the information otherwise provided by the intermods, as shown by curve 820. Therefore, the number of intermod envelope data points increases only slightly as the number of carriers increases. For example, for five carriers, the intermod simulation technique generates only 69 intermod envelope data points, while for 50 carriers, the intermod simulation technique generates only 879 intermod envelope data points. Accordingly, the increase in the number intermod envelope data points that need to be calculated to determine ten times the number of carriers (from 5 carriers to 50 carriers) is small, as a practical matter. As compared to the conventional intermod simulation technique, the present embodiment enables far fewer data point determinations, particularly for the higher numbers of carriers (e.g., the conventional intermod simulation technique requires over 100 times more calculations).

As a practical matter, there may be an even greater difference because, according to the conventional intermod simulation technique, additional processing is required to add the intermods of curve 810 together to create corresponding intermod envelopes. In comparison, the intermod envelopes have already been created (since no actual intermods are calculated) according to the representative embodiment. Furthermore, the representative embodiment actually requires only half of the intermod envelope data points indicated to create the entire intermod envelope, due to symmetry.

The RF and microwave design community will benefit from having system level behavioral simulators that support high carrier count simulation. Carrier counts as low as five will benefit from the improved speed and performance. The various embodiments thus enable simulation of high carrier count signals previously thought to be unsimulatable.

The various operations discussed above with reference to FIGS. 4, 5 and 7 may be included in logic executable by a computer processor or other processing device, such as the processing unit 310, discussed above, and/or some combination of processing devices (e.g., by distributed processing). The operations may be implemented using internal logic or software, stored on a computer readable medium, and executable by one or more computer processors, ASICs, FPGAs or combinations thereof, as discussed above.

The various embodiments provide the ability to simulate intermods of signals having up to hundreds of carriers in a fraction of second for a single non-linearity. Common RF architectures may have hundreds of non-linearities. Furthermore, since only the envelope of each resultant intermod combination is calculated, memory, processing speed and graphical display issues are addressed.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A method of determining effects of a non-linear amplifier in a wireless communication device in response to an input signal comprising a plurality of carriers, the method comprising:
receiving parameters of the input signal at a processor, the parameters comprising a total number of carriers, a frequency of one carrier, and a spacing between adjacent carriers of the input signal;
identifying a plurality of combinations of intermods in an output signal to be provided by the non-linear amplifier in response to the input signal, the intermod combinations corresponding to a desired intermod order;
synthesizing a plurality of intermod envelopes, using the processor, respectively corresponding to the plurality of intermod combinations according to a corresponding plurality of predetermined algorithms using at least one of the total number of carriers, the frequency of the one carrier, and the spacing between adjacent carriers; and
determining the effects of the non-linear amplifier based at least in part on the plurality of intermod envelopes,
wherein each predetermined algorithm of the plurality of predetermined algorithms comprises a predetermined intermod frequency algorithm based on an independent frequency array for the corresponding intermod combination, and a predetermined intermod amplitude algorithm based on an identified pattern of intermod amplitude arrays for the corresponding intermod combination.

2. The method of claim 1, wherein the desired intermod order is at least a $2^{nd}$ order distortion.

3. The method of claim 1, wherein the spacing between adjacent carriers is the same.

4. The method of claim 3, wherein it is assumed that amplitudes of the carriers are the same.

5. The method of claim 1, wherein the predetermined intermod amplitude algorithm for each intermod combination uses the total number of carriers.

6. The method of claim 5, wherein the patterns in the intermod amplitude arrays are identified using multiple numbers of total carriers and whether the number of total carriers is even or odd, and wherein the predetermined intermod amplitude algorithm is created to capture the patterns in the intermod amplitude arrays.

7. A method of determining effects of a non-linear amplifier in response to an input signal comprising a plurality of carriers, using a signal generator module, a non-linear amplifier module and an intermod envelope module of a processor, the method comprising:
synthesizing a plurality of intermod envelopes respectively corresponding to a plurality of intermod combinations in an output signal to be provided by the non-linear amplifier in response to the input signal, using a corresponding plurality of predetermined intermod frequency algorithms for generating independent frequency arrays for the plurality of intermod combinations, respectively, and a corresponding plurality of predetermined intermod amplitude algorithms for generating amplitude arrays for the plurality of intermod combinations, respectively; and
determining the effects of the non-linear amplifier based at least in part on the plurality of synthesized intermod envelopes,
wherein each of the predetermined intermod frequency algorithms uses a total number of carriers of the input signal, a frequency of a carrier, and a spacing between adjacent carriers of the input signal, and
wherein each predetermined intermod amplitude algorithm is determined by calculating intermod envelopes for input signals having different numbers of carriers, identifying a pattern of intermod amplitude arrays emerging from the calculated intermod envelopes, and creating the predetermined intermod amplitude algorithm to capture the pattern.

8. The method of claim 7, wherein each of the predetermined intermod amplitude algorithms uses the total number of carriers of the input signal.

9. The method of claim 7, wherein it is assumed that amplitudes of the carriers are the same, and that the spacing between the adjacent carriers is the same.

10. A signal generating device for determining effects of a non-linear amplifier in response to an input signal having a plurality of carriers, the device comprising:
a processor for executing a computer program, causing the processor to perform a method comprising:
receiving parameters of the input signal, including a total number of carriers, a frequency of a carrier, and a spacing between adjacent carriers;
identifying a plurality of intermod combinations in an output signal to be provided by the non-linear amplifier in response to the input signal, the intermod combinations corresponding to a desired intermod order;

synthesizing a plurality of intermod envelopes corresponding to the plurality of intermod combinations, respectively, according to a corresponding plurality of predetermined algorithms using at least one of the total number of carriers, the frequency of the carrier, and the spacing between adjacent carriers; and determining the effects of the non-linear amplifier based at least in part on the plurality of synthesized intermod envelopes, wherein each predetermined algorithm of the plurality of predetermined algorithms comprises a predetermined intermod frequency algorithm based on an independent frequency array for the corresponding intermod combination, and a predetermined intermod amplitude algorithm based on an identified pattern of intermod amplitude arrays for the corresponding intermod combination.

11. The device of claim 10, further comprising:
a memory unit, accessible by the processor, for storing the plurality of predetermined algorithms.

12. The device of claim 11, further comprising:
a display configured to display the plurality of synthesized intermod envelopes corresponding to the plurality of intermod combinations.

13. The device of claim 11, wherein the desired intermod order is at least a $2^{nd}$ order distortion.

14. The device of claim 11, wherein the spacing between adjacent carriers is the same, and wherein it is assumed that amplitudes of the carriers are the same.

15. The device of claim 11, wherein each of the predetermined intermod frequency algorithm and the predetermined intermod amplitude algorithm is stored in the memory unit.

16. The device of claim 10, further comprising:
a display configured to display the plurality of synthesized intermod envelops.

* * * * *